(12) United States Patent
Xu et al.

(10) Patent No.: US 7,812,361 B2
(45) Date of Patent: Oct. 12, 2010

(54) LIGHT EMITTING DIODE

(75) Inventors: Zhen-Feng Xu, Beijing (CN); Guo-Fan Jin, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/964,556

(22) Filed: Dec. 26, 2007

(65) Prior Publication Data
US 2008/0277681 A1 Nov. 13, 2008

(30) Foreign Application Priority Data
May 9, 2007 (CN) .................. 2007 1 0074324

(51) Int. Cl.
*H01L 33/00* (2010.01)
(52) U.S. Cl. ............... 257/98; 257/79; 257/99; 257/100; 257/E25.028; 257/E25.032
(58) Field of Classification Search .............. 257/79, 257/98, 99, 100, E25.028, E25.032
See application file for complete search history.

(56) References Cited

U.S. PATENT DOCUMENTS

| 7,483,466 B2* | 1/2009 | Uchida et al. ............ 372/50.11 |
| 2005/0205883 A1 | 9/2005 | Wierer et al. |
| 2006/0145177 A1* | 7/2006 | Hagimoto et al. ............. 257/99 |
| 2006/0278888 A1 | 12/2006 | Kim et al. |
| 2007/0121694 A1* | 5/2007 | Okamoto ............... 372/50.124 |
| 2007/0201527 A1* | 8/2007 | Hori et al. ............. 372/50.124 |
| 2008/0061304 A1* | 3/2008 | Huang et al. .................. 257/79 |

FOREIGN PATENT DOCUMENTS

| CN | 1905219 A | 1/2007 |
| TW | 200603436 | 1/2006 |

OTHER PUBLICATIONS

Zhen-Feng Xu, Design of a high extraction light-emitting diode with two crossed grating structures, 2006 Proceedings of 2006 National photovoltaic technology symposium, Aug. 7, 2006, 693-697, vol. F, China.

\* cited by examiner

*Primary Examiner*—Shouxiang Hu
*Assistant Examiner*—Samuel A Gebremariam
(74) *Attorney, Agent, or Firm*—Jeffrey T. Knapp

(57) ABSTRACT

A light emitting diode includes a substrate, a reflecting layer, an active layer, a transparent electrode, a first photonic crystal structure, and a second photonic crystal structure. The reflecting layer is disposed on the substrate. The active layer is disposed on the reflecting layer. The transparent electrode is disposed on the active layer and includes an upper surface and a lower surface. The lower surface of the transparent electrode combines with the active layer. The first photonic crystal structure is formed on the upper surface of the transparent electrode. The second photonic crystal structure formed in the active layer.

2 Claims, 3 Drawing Sheets

LIGHT EMITTING DIODE

BACKGROUND

1. Field of the Invention

The present invention relates to light emitting diodes and, particularly, to a high extraction efficiency light emitting diode.

2. Discussion of Related Art

In recent years, high efficiency light emitting diodes (LEDs) made with GaN-based semiconductors are widely used in different fields, such as display devices, large electronic bill boards, street lights, car lights, and specially in illumination fields. The light emitting diodes are environmentally friendly, have long working life, and low power consumption.

A conventional LED commonly includes an N-type semiconductor layer, a P-type semiconductor layer, an active channel layer, an anode, and a cathode. The active channel layer is disposed between the N-type semiconductor layer and the P-type semiconductor layer. The anode is disposed on the P-type semiconductor layer. The cathode is disposed on the N-type semiconductor layer. Typically, the anode is a transparent electrode. In operation, a positive voltage and a negative voltage are applied respectively to the P-type semiconductor layer and the N-type semiconductor layer. Thus, holes in the P-type semiconductor layer and electrons in the N-type semiconductor layer can enter the active channel layer and combine with each other to emit visible light.

However, the refractive index of the package material of the LED should match the refractive index of the semiconductor, otherwise the produced light gets partially reflected back into the semiconductor. In the semiconductor, the light may be absorbed and turned into additional heat, thus lowering the efficiency of the LED. This type of reflection also occurs at the surface of the package if the LED is coupled to a medium with a different refractive index such as a glass fiber or air. A large difference in the refractive indexes makes the reflection quite substantial, and this is usually one of the dominant causes of light extraction inefficiency of LEDs.

What is needed, therefore, is to provide a light emitting diode with elevated extraction efficiency.

SUMMARY OF THE INVENTION

In one embodiment, a light emitting diode includes a substrate, a reflecting layer, an active layer, a transparent electrode, a first photonic crystal structure, and a second photonic crystal structure. The reflecting layer is disposed on the substrate. The active layer is disposed on the reflecting layer. The transparent electrode is disposed on the active layer and includes an upper surface and a lower surface. The lower surface of the transparent electrode combines with the active layer. The first photonic crystal structure is formed on the upper surface of the transparent electrode. The second photonic crystal structure is formed in the active layer.

In operation, emitted light at relatively small incidence angles can be diffracted and transmitted to the outside through the first photonic crystal structure. Light at relatively large incidence angles can be reflected back to the active layer and diffracted through the second photonic crystal structure to reduce the incidence angles thereof. As such, the light can be transmitted to the outside through the first photonic crystal structure. Thereby, the reflection and absorption of light can be reduced by the first photonic crystal structure and the second photonic crystal structure. And, the extraction efficiency of the light emitting diode can be elevated.

Other advantages and novel features of the present light emitting diode will become more apparent from the following detailed description of preferred embodiments when taken in conjunction with the accompanying drawings.

BRIEF DESCRIPTION OF THE DRAWINGS

Many aspects of the present light emitting diode can be better understood with reference to the following drawings. The components in the drawings are not necessarily to scale, the emphasis instead being placed upon clearly illustrating the principles of the present light emitting diode.

Figure 1:
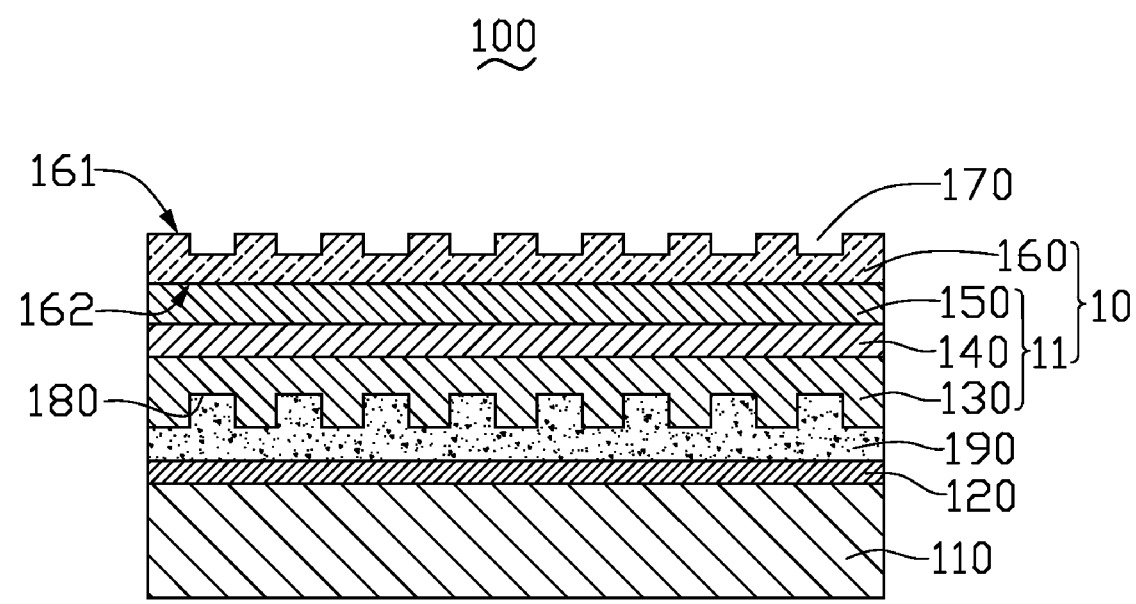
FIG. 1 is a cross-sectional view of a light emitting diode, in accordance with a present embodiment.

Corresponding reference characters indicate corresponding parts throughout the several views. The exemplifications set out herein illustrate at least one preferred embodiment of the present light emitting diode, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present light emitting diode.

Referring to FIG. 1, a light emitting diode 100 in the present embodiment includes a substrate 110, a reflecting layer 120, and an LED matrix 10. The LED matrix 10 includes an active layer 11 and a transparent electrode 160 formed on the active layer 11. The active layer includes a first semiconductor layer 130 formed on the reflecting layer 120, an active channel layer 140 formed on the first semiconductor layer 130, and a second semiconductor layer 150 formed on the active channel layer 140.

The transparent electrode 160 includes an upper surface 161 and a lower surface 162. The lower surface 162 of the transparent electrode 160 is attached to the second semiconductor layer 150. The upper surface 161 of the transparent electrode 160 includes a first photonic crystal structure 170. The first photonic crystal structure 170 includes a lattice of blind holes.

The active layer 11 includes a second photonic crystal structure 180. The second photonic crystal structure 180 includes a lattice of blind holes. In one embodiment, the second photonic crystal structure 180 can, beneficially, be formed on the interface of the active channel layer 140 and the first semiconductor layer 130. Further, the second photonic crystal structure 180 can, opportunely, be formed on the lower surface of the active channel layer 140 or be formed on the upper surface of the first semiconductor layer 130. In another embodiment, the second photonic crystal structure 180 can, advantageously, be formed on the lower surface of the first semiconductor layer 130 (i.e. the surface near the reflecting layer 120 and the lower surface of the active layer 11). In the present embodiment, the second photonic crystal structure 180 is formed on the lower surface of the first semiconductor layer 130.

Quite usefully, an adhesive layer 190 can be further disposed between the first semiconductor layer 130 and the reflecting layer 120. Thereby, the active layer 11 is adhered to the reflecting layer 120 by the adhesive layer 190.

Figure 2:
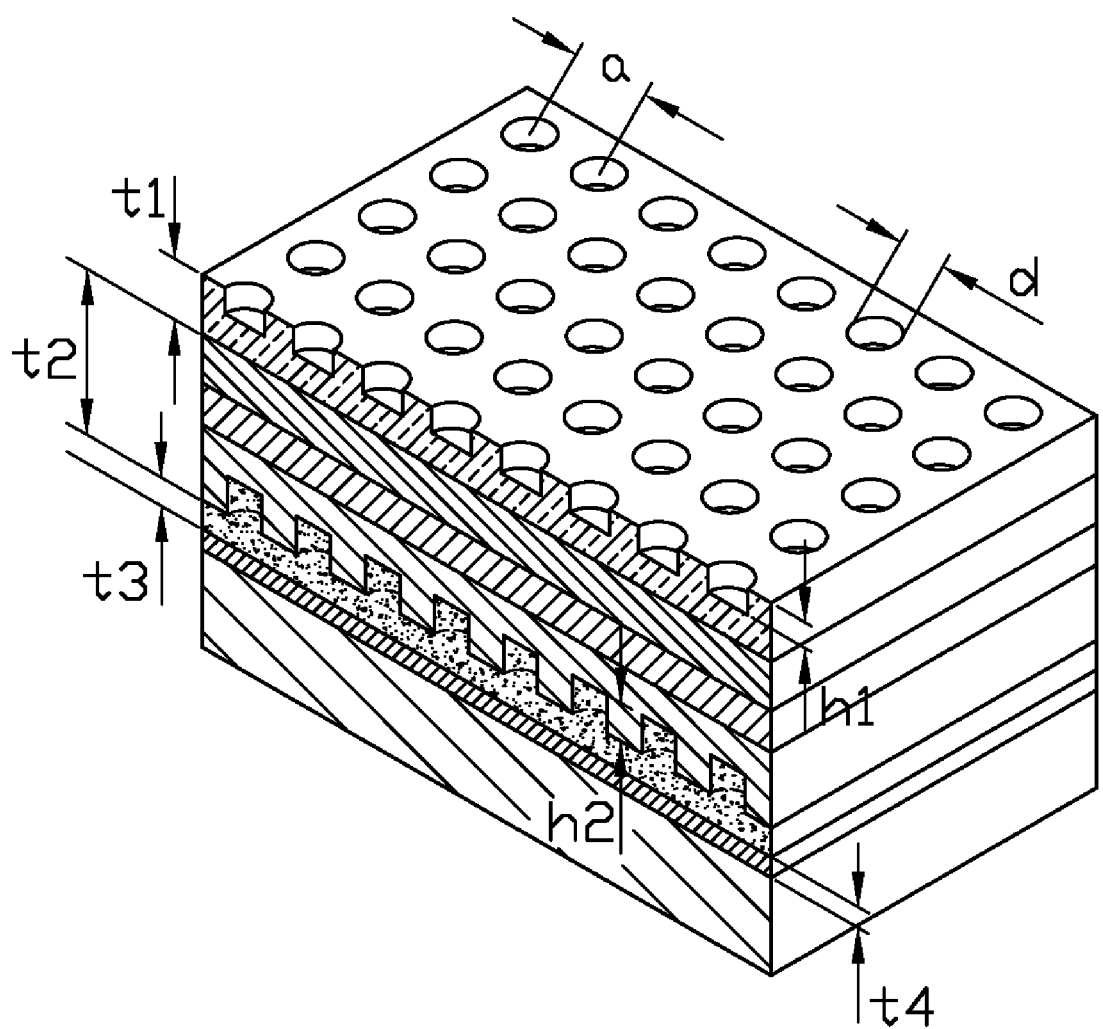
FIG. 2 is a perspective view of the light emitting diode of FIG. 1.

Referring to FIG. 2, a character of the photonic crystal structure can be represented by three parameters: lattice constant (distance between centers of two adjacent holes) (a), hole diameter (d), and hole depth (h). Parameters a, d, and h of the first photonic crystal structure 170 and the second photonic crystal structure 180 are, respectively, in the same range. In the first photonic crystal structure 170 and the second photonic crystal structure 180, a is in the approximate range from 0.5 to 2.0 microns, d is in the approximate range from 0.5 a to 0.9 a, and h is in the approximate range from 0 to 0.5 microns. When a, d and h of the first photonic crystal structure 170 are respectively equal to that of the second photonic crystal structure 180, the first photonic crystal structure 170 and the second photonic crystal structure 180 have the same structure. It is to be understood that the first photonic crystal structure 170 and the second photonic crystal structure 180 can have different structures (i.e. a, d and h of the first photonic crystal structure 170 are respectively different from a, d, and h of the second photonic crystal structure 180).

The substrate 110 can, beneficially, be made of a material selected from a group consisting of sapphire, gallium arsenide (GaAs), indium phosphide (InP), silicon (Si), silicon carbide (SiC), and silicon nitride ($Si_3N_4$). The reflecting layer 120 can, usefully, be made of a metallic material such as silver and aluminum (Al). The first conductive layer 130 is a N-type semiconductor layer, and beneficially, made of N-type gallium nitride (GaN), N-type gallium arsenide (GaAs), or N-type copper phosphide ($Cu_3P$). The active channel layer 140 can, advantageously, be made of indium gallium nitride (InGaN). The second semiconductor layer 150 is a P-type semiconductor layer, and suitably, made of P-type gallium nitride (GaN), P-type gallium arsenide (GaAs), or P-type copper phosphide ($Cu_3P$). The transparent electrode 160 can, advantageously, be made of indium tin oxide (ITO). The adhesive layer 190 can, usefully, be made of epoxy resin adhesive or UV-curing adhesive.

A method for fabricating the above-mentioned light emitting diode 100 includes the following steps: (a) providing a LED matrix 10 formed on a substrate 110, the LED matrix 10 including a first semiconductor layer 130, an active channel layer 140, a second semiconductor layer 150, and a transparent electrode 160, the active channel layer 140 is disposed between the first semiconductor layer 130 and the second semiconductor layer 150, and the transparent electrode 160 is disposed on the surface of the second semiconductor layer 150 far from the active channel layer 140; (b) separating the substrate 110 and the LED matrix 10; (c) forming a second photonic crystal structure 180 on the first semiconductor layer 130; (d) forming a first photonic crystal structure 170 on the transparent electrode 160; (e) forming a reflecting layer 120 on the substrate 110; and (f) combining the substrate 110 with the LED matrix 10.

In step (a), the LED matrix 10 can, beneficially, be formed on the substrate 110 by a series of chemical/physical deposition processes widely used in the art. In the present embodiment, the substrate 110 is made of sapphire, the first semiconductor layer 130 is made of N-type gallium nitride (GaN), the second semiconductor layer 150 is made of P-type gallium nitride (GaN), the active channel layer 140 is made of indium gallium nitride (InGaN), and the transparent electrode 160 is made of indium tin oxide (ITO).

In step (b), the substrate 110 and the LED matrix 10 can, beneficially, be separated from the interface thereof by any method known in the art (e.g. a Laser Lift-off method). As such, the independent substrate 110 and the independent LED matrix 10 including the first semiconductor layer 130, active channel layer 140, the second semiconductor layer 150, and the transparent electrode 160 can be achieved.

Step (c) further includes the substeps of: (c1) cleaning the first semiconductor layer 130 of the LED matrix 10; (c2) forming a etch-resisting layer on the first semiconductor layer 130 (e.g. a silicon dioxide layer); (c3) forming an electron-resisting layer on the etch-resisting layer, and forming a pattern of the second photonic crystal structure on the electron-resisting layer; (c4) transferring the pattern of the second photonic crystal structure onto the etch-resisting layer; and (c5) transferring the pattern of the second photonic crystal structure onto the first semiconductor layer 130.

In step (c1), the first semiconductor layer 130 can, usefully, be sonicated in acetone, isopropanol, and deionized water respectively, and dried in a flowing nitrogen gas.

In step (c2), due to a poor etch-resisting ability of the electron-resisting layer, the etch-resisting layer (i.e. the silicon dioxide layer) can protect the first semiconductor layer 130 from being destroyed during the etching process.

Even trace amounts of moisture on the surface of the etch-resisting layer will affect combination of the etch-resisting layer and the electron-resisting layer. Therefore, in step (c3), the surface of the etch-resisting layer should be cleaned and dried in a flowing nitrogen gas before the electron-resisting layer is formed thereon. Quite suitably, the etch-resisting layer can be dried at a temperature (e.g. about 80° C. to 100° C.).

In step (c3), the electron-resisting layer can, beneficially, be formed on the etch-resisting layer by means of spin coating. The pattern of the second photonic crystal structure can, usefully, be formed on the electron-resisting layer by the method of electron beam lithography (EBL). Quite suitably, the electron-resisting layer is polymethyl methacrylate (PMMA).

In step (c4), the pattern of the second photonic crystal structure can, opportunely, be transferred onto the etch-resisting layer by means of dry etching. Etching depth is equal to the depth of the etch-resisting layer. As such, the first semiconductor layer 130 is exposed in the pattern of the second photonic crystal structure on the etch-resisting layer. Then, the LED matrix 10 can, beneficially, be sonicated in acetone, isopropanol, and deionized water respectively for a period of time (e.g. 5 minutes). Finally, the electron-resisting layer is removed by UV-radiation combined ozone cleaning process.

In step (c5), the pattern of the second photonic crystal structure can, suitably, be transferred onto the first semiconductor layer 130 by means of dry etching. Quite usefully, the etching gas used in dry etching is boron trichloride ($BCl_3$). After the second photonic crystal structure is formed on the first semiconductor layer 130, the etch-resisting layer can, beneficially, be removed by using hydrofluoric acid.

In step (d), the first photonic crystal structure 170 can be formed on the transparent electrode 160 by the similar steps as in step (c). In step (e), the reflecting layer 120 can be formed on the substrate 110 by means of physical vapor deposition, or chemical vapor deposition. Quite usefully, the reflecting layer 120 can be made of metallic materials, or alloys thereof.

In step (f), an adhesive layer 190 can be further disposed between the first semiconductor layer 130 and the reflecting layer 120. Therefore, the substrate 110 with a reflecting layer 120 formed thereon can be adhered to the LED matrix 10 by the adhesive layer 190.

A negative electrode is further disposed on the substrate 110. In use, a positive voltage and a negative voltage are respectively applied to the positive electrode (i.e. the transparent electrode 160) and the negative electrode. As such, in the electrical field between the positive electrode and the negative electrode, the holes in the second semiconductor layer 150 move towards the first semiconductor layer 130, and the electrons in the first semiconductor layer 130 move towards the second semiconductor layer 150. Accordingly, the holes and the electrons can enter the active channel layer 140 and combine with each other to emit visible light.

The light emitted from the active channel layer 140 reaches the transparent electrode 160 at different incidence angles. The first photonic crystal structure 170 can diffract the light at relatively small incidence angles and transmit the diffracted light to the outside. The light at relatively large incidence angles is reflected back into the active layer 11 and arrives at the first semiconductor layer 130. Through diffraction in the second photonic crystal structure 180 on the first semiconductor layer 130, the incidence angles of the reflected light can be reduced. Therefore, the light can transmit through the second photonic crystal structure 180, and then, be reflected by the reflecting layer 120. After being twice diffracted by the second photonic crystal structure 180, the incidence angles of the light are reduced. As such, when the light having the reduced incidence angles arrives at the transparent electrode 160, the light can be diffracted by the first photonic crystal structure 170 and transmitted to outside. Diffraction by the second photonic crystal structure 180 and the first photonic crystal structure 170 can reduce the reflection of the light. Thereby, the absorption of the light can be reduced, and the extraction efficiency of the light emitting diode 100 can be elevated.

In the present embodiment, the light emitting property of the light emitting diode 100 has been tested. The active layer 11 of the light emitting diode 100 is made of gallium nitride (GaN) at a wavelength of 450 nanometers. The thickness of the reflecting layer 120 (t4) is about 0.1 micron; the thickness of the adhesive layer 190 (t3) is about 0.1 micron; the thickness of the active layer 11 (t2) is about 2.5 microns; and the thickness of the transparent electrode 160 (t1) is 0.3 micron. The refractive index of the transparent electrode 160 and the adhesive layer 190 are about 2.0 and 1.5. The complex refractive index of the active layer 11 and the reflecting layer 120 are 2.5+i0.02 and 0.1+i5.6. Parameters a and d of the second photonic crystal structure 180 are equal to a and d of the first photonic crystal structure 170. In the present embodiment, a is equal to 0.8 micron, d is equal to 0.8 a, the hole depth of each of the holes of the first photonic crystal structure 170 (h1) is equal to 0.2 micron, the hole depth of each of the holes of the second photonic crystal structure 180 (h2) is in the approximate range from 0 to 0.5 micron.

Figure 3:
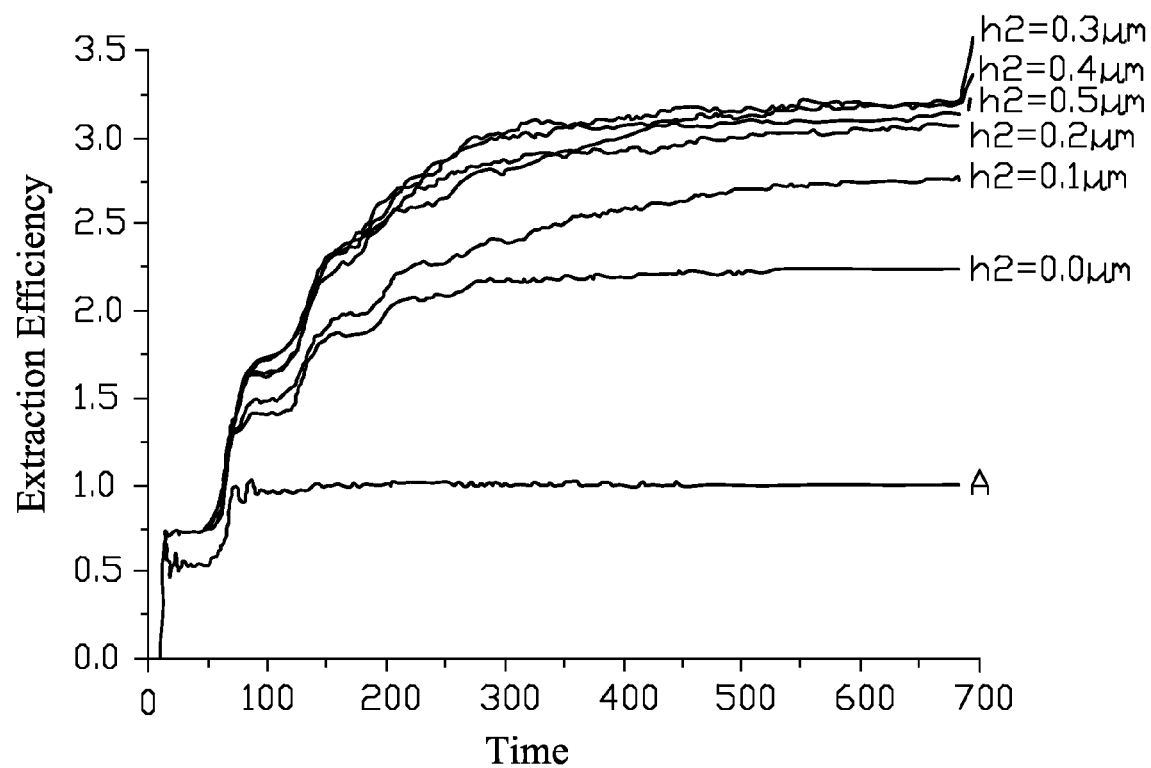
FIG. 3 is a graph showing computer simulation results of extraction efficiencies of the light emitting diode of FIG. 1 compared with conventional diode over time.

The extraction efficiency of the light emitting diode 100 with the above-described structure is calculated by the method of finite difference time domain (FDTD). The changes of the normalized efficiencies with different light emitting diode structures are calculated. Referring to FIG. 3, the horizontal axis relates to time. The vertical axis relates to extraction efficiency ratios. The extraction efficiency ratios are defined as the calculated extraction efficiency of the LED 100 with different structures to a standard extraction efficiency of an LED without the first photonic crystal structure 170 and the second photonic crystal structure 180. The structure of the LED 100 changes as h2 from 0 to 0.5 microns. A M-LED relates to curve A and represents an LED without the first photonic crystal structure 170 and the second photonic crystal structure 180. The extraction efficiency ratio of M-LED is generally equal to 1. When h2 is 0, the LED is named as SPC-LED and without the second photonic crystal structure 180. As shown in FIG. 3, the extraction efficiency of the SPC-LED is about two times that of the M-LED. When h2 is 0.3 micron, the extraction efficiency of the LED 100 is about 3.2 times that of the M-LED. The extraction efficiency of the LED with two photonic crystal structures is better than the LED with one photonic crystal structure.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A light emitting diode comprising:
   a substrate;
   a reflecting layer disposed on the substrate;
   an adhesive layer disposed on the reflecting layer;
   an active layer disposed on the adhesive layer, wherein the active layer comprises:
      a first semiconductor layer comprising an upper surface, a lower surface, and a second photonic crystal structure; the second photonic crystal structure comprising a lattice of blind holes, the lattice of blind holes of the second photonic crystal structure are formed on the lower surface of the first semiconductor layer; the lower surface of the first semiconductor layer is in contact with the adhesive layer, at least a portion of the adhesive layer is located in the lattice of blind holes;
      an active channel layer located on the upper surface of the first semiconductor layer, the active channel layer comprising an upper surface and a lower surface; and
      a second semiconductor layer located on the upper surface of the active channel layer; and
   a transparent electrode disposed on the second semiconductor layer, the transparent electrode comprising an upper surface and a lower surface, the lower surface of the transparent electrode is in contact with the second semiconductor layer, the transparent electrode comprising a first photonic crystal structure, the first photonic crystal structure comprising a lattice of blind holes, the lattice of blind holes of the first photonic crystal structure being formed on the upper surface of the transparent electrode.

2. A light emitting diode comprising:
   a substrate;
   a reflecting layer disposed on the substrate;
   an active layer disposed on the reflecting layer, wherein the active layer comprises:
      a first semiconductor layer disposed adjacent to the reflecting layer, the first semiconductor layer comprising an upper surface, and a lower surface,
      an active channel layer located on the upper surface of the first semiconductor layer, the active channel layer comprising an upper surface, a lower surface, and a second photonic crystal structure; the second photonic crystal structure comprising a lattice of blind holes, the lattice of blind holes are formed on the lower surface of the active channel layer; and
      a second semiconductor layer disposed on the upper surface of the active channel layer; and
   a transparent electrode disposed on the second semiconductor layer, the transparent electrode comprising an upper surface and a lower surface, the lower surface of the transparent electrode is in contact with the second semiconductor layer, the transparent electrode comprising a first photonic crystal structure, the first photonic crystal structure comprising a lattice of blind holes, the lattice of blind holes being formed on the upper surface of the transparent electrode.

* * * * *